US008416386B2

(12) United States Patent
Margeson et al.

(10) Patent No.: US 8,416,386 B2
(45) Date of Patent: Apr. 9, 2013

(54) CONFORMING SEATS FOR CLAMPS USED IN MOUNTING AN OPTICAL ELEMENT, AND OPTICAL SYSTEMS COMPRISING SAME

(75) Inventors: Christopher S. Margeson, Mountain View, CA (US); Douglas C. Watson, Campbell, CA (US)

(73) Assignee: Nikon Corporation, Tokyo (JP)

( * ) Notice: Subject to any disclaimer, the term of this patent is extended or adjusted under 35 U.S.C. 154(b) by 587 days.

(21) Appl. No.: 12/047,244

(22) Filed: Mar. 12, 2008

(65) Prior Publication Data
US 2008/0225255 A1 Sep. 18, 2008

Related U.S. Application Data

(60) Provisional application No. 60/906,968, filed on Mar. 13, 2007.

(51) Int. Cl.
G03B 27/42 (2006.01)
G03B 27/52 (2006.01)
G03B 27/54 (2006.01)
G02B 7/02 (2006.01)

(52) U.S. Cl.
USPC ............. 355/53; 355/55; 355/67; 359/818; 359/819

(58) Field of Classification Search .............. 355/53, 355/67, 55; 359/818, 819
See application file for complete search history.

(56) References Cited

U.S. PATENT DOCUMENTS

| 5,037,184 | A | 8/1991 | Ealey |
| 6,239,924 | B1 | 5/2001 | Watson et al. |
| 6,859,337 | B2 * | 2/2005 | Oshino et al. ............... 359/819 |
| 6,873,478 | B2 | 3/2005 | Watson |
| 6,878,042 | B2 * | 4/2005 | Oshino ..................... 451/41 |
| 6,922,293 | B2 | 7/2005 | Watson et al. |
| 6,930,842 | B2 | 8/2005 | Shibazaki |
| 6,989,922 | B2 | 1/2006 | Phillips et al. |
| 7,154,684 | B2 | 12/2006 | Shibazaki |
| 7,580,207 | B2 * | 8/2009 | Melzer ..................... 359/822 |
| 2003/0234918 | A1 | 12/2003 | Watson |
| 2005/0211867 | A1 | 9/2005 | Margeson |

FOREIGN PATENT DOCUMENTS

| WO | WO 04/001478 | 12/2003 |
| WO | WO 04/001509 | 12/2003 |
| WO | WO 2007010011 A2 * | 1/2007 |

OTHER PUBLICATIONS

U.S. Appl. No. 60/390,879, filed Jun. 21, 2002, Watson.

* cited by examiner

*Primary Examiner* — Steven H Whitesell Gordon
(74) *Attorney, Agent, or Firm* — Klarquist Sparkman, LLP

(57) ABSTRACT

Clamps are disclosed for holding an optical element relative to a support. An exemplary clamp includes first and second arms and a member connecting the arms such that a portion of a mounting feature of the optical element is between the first and second arms. The first arm applies a clamping force toward a respective portion of the mounting feature, and the second arm includes a seat. The seat has at least upper and intermediate portions. The upper portion engages the respective location on the mounting feature. The intermediate portion is situated between the upper portion and the second arm and has a lateral thickness less than the lateral thickness of the upper portion. The intermediate portion exhibits elastic and plastic deformability sufficient for any moment applied by the clamp to the mounting feature to be limited to less than a designated peak moment, while maintaining substantially full engagement of the upper portion with the respective location.

38 Claims, 9 Drawing Sheets

FIG. 2(D)
Prior Art
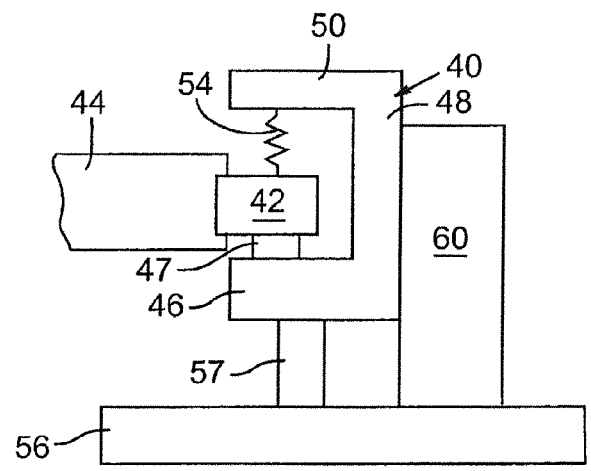
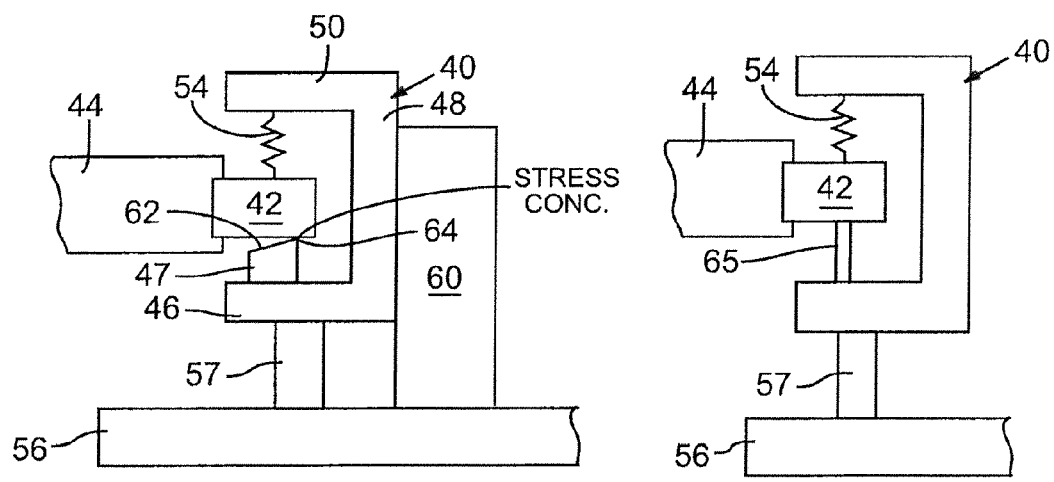
FIG. 2(E)
Prior Art
FIG. 3
Prior Art

CONFORMING SEATS FOR CLAMPS USED IN MOUNTING AN OPTICAL ELEMENT, AND OPTICAL SYSTEMS COMPRISING SAME

CROSS REFERENCE TO RELATED APPLICATION

This application claims priority to, and the benefit of, U.S. Provisional Application No. 60/906,968, filed on Mar. 13, 2007, which is incorporated herein by reference in its entirety.

FIELD

This disclosure pertains to, inter alia, mountings for optical elements such as reflective optical elements, lenses, and the like. More specifically, the disclosure pertains to mountings comprising holding devices and seats (contact pads) for optical elements.

BACKGROUND

Optical systems comprise one or multiple (usually multiple) optical elements. The particular range(s) of wavelength(s) with which an optical system is used often dictates whether the optical system is refractive, reflective, or a combination of refractive and reflective. The term "optical element" can include, and is not limited to, any of various lenses, mirrors, reticles, windows, filters, and gratings, as would be used in an optical system or used alone.

Optical systems used for extremely demanding work must exhibit a very high level of optical performance. High optical performance requires that the optical elements be manufactured and placed relative to each other with extremely high accuracy and precision. These optical systems are also designed to exhibit minimal distortion and aberration, and frequently are configured to resist and/or compensate for adverse effects of shipping, storage, and prolonged service. For use in an optical system or alone, a "mounting" is a device or structure that essentially holds an optical element. Mountings for use in high-performance optical systems must be designed and constructed with extremely high accuracy and precision, must hold their respective optical elements without causing significant uncorrectable aberrations or other optical faults, and must not over-constrain their respective optical elements. One general class of mountings encompasses various clamps that engage the optical element itself or a tab, projection, flange, or other mounting structure integral with or attached to the optical element.

One application of high-performance optical systems as summarized above is microlithography, which generally is a technique used for establishing, by exposure printing, the locations and basic configurations of electronic elements on the substrates of semiconductor integrated circuits, displays, and other "microelectronic" devices. In these devices the number of individual circuit elements on a substrate can be extremely large (up to hundreds of millions). Hence, the individual elements are extremely small and in very close proximity to one another at high integration density. The trend is toward increased miniaturization of the elements and denser integration of the elements. Accommodating this trend requires microlithography systems providing increasingly finer resolution.

In microlithography the resolution of an optical system is affected by several variables including the wavelength of the energy used for making microlithographic exposures. To achieve progressively finer resolution of the exposures, increasingly shorter wavelengths of exposure light are being used or considered for use. Whereas most microlithography systems currently in use perform exposures using deep-UV light produced by excimer lasers ($\lambda$=248 or 193 nm), substantial effort is being directed to the development of a practical microlithography system utilizing extreme ultraviolet (EUV) light, having a wavelength in the vicinity of 13.5 nm, as the exposure light.

Most microlithography systems utilizing deep-UV exposure light have illumination-optical systems and imaging-optical systems that are at least partially refractive, in which the optical elements in the refractive optical systems are made of quartz and/or calcium fluoride. These systems include those utilizing certain of the excimer-laser wavelengths such as 193 and 248 nm. Use of EUV requires fully reflective optical systems.

Regardless of whether the optical system is refractive, reflective, or a combination thereof, it is critical that the optical elements of the system be manufactured with extremely high accuracy to achieve the necessary corrections of aberrations and to achieve the required levels of optical performance. In addition, these optical elements must be mounted in ways that withstand shipping and installation activity and that maintain the specified optical performance of the elements during use.

Hence, these and other high-performance optical systems include optical-element mountings that are configured not only to hold the optical elements securely but also to minimize or eliminate external effects such as gravitational sag, thermal stresses, and other deleterious variables acting on the optical elements. To such end, the mountings can be "kinematic" or "quasi-kinematic."

In general, the mounting of an optical element or other object can be defined in terms of six independent coordinates or "degrees of freedom" (x, y, z, $\theta_x$, $\theta_y$, $\theta_z$). Three of the coordinates (x, y, z) are translational along mutually perpendicular axes of an arbitrary coordinate system, and three are rotational ($\theta_x$ or "roll," $\theta_y$ or "pitch," and $\theta_z$ or "yaw") about the respective axes denoted in the subscripts. In a true kinematic mounting, the number of constrained degrees of freedom (axes of free motion) and the number of physical constraints applied to the mounting total six. These physical constraints are independent and not redundant.

An example quasi-kinematic mounting is discussed in U.S. Pat. No. 6,239,924 to Watson et al., issued on May 29, 2001, and incorporated herein by reference. The mounting discussed in the '924 patent supports a lens on a set of mounting seats. Situated between the mounting seats are soft mounts that distribute the gravitational load of the lens. Another example is discussed in International Patent Publication No. WO 02/16993 A1, published on Feb. 28, 2002, in which the optical element is supported on bearing surfaces (seats) on a base member. The base member includes clamping members each including a pad member with a flexible thin-plate portion through which the optical element is clamped using bolts. An example kinematic mounting employing certain configurations of flexures is discussed in U.S. Pat. No. 6,922,293 to Watson et al., issued on Jul. 26, 2005, and incorporated herein by reference.

It is known to support an optical element, such as a deformable mirror, using multiple high-stiffness actuators such as PZT actuators as discussed, for example, in U.S. Pat. No. 5,037,184 to Ealey, issued on Aug. 6, 1991. Unfortunately, these types of mountings tend to over-constrain the optical element. Another deformable mirror-actuation system is disclosed in U.S. Pat. No. 6,989,922 to Phillips et al., issued on Jan. 24, 2006. Reference is also made to Hardy, "Active Optics: A New Technology for the Control of Light," *Trans. IEEE*, Vol. 60, No. 6 (1978).

Optical members in high-performance optical systems typically are very sensitive to their environment. For example, optical elements can experience gravitational sag and/or significant thermal gradients, which can impair optical performance. Also, excessive holding force or holding force that is too constraining to the element may damage or deform the element or otherwise cause adverse optical effects. If the element is mounted by clamps (which ordinarily tend to concentrate holding forces), possible deformation of or damage to the element is usually a concern. To minimize adverse effects, it is generally desirable to reduce clamping force as much as possible while maintaining sufficient holding friction to support the optical element.

Deformation of an optical element by its mounting can be difficult to control or eliminate because deformation often comprises multiple components that are difficult to distinguish from one another and to characterize. For example, relatively large components of deformation many be caused by manufacturing variations or design shortcomings in the mounting and/or in the optical element itself. Relatively small and more localized components of deformation may arise from thermal effects on the optical element and/or its mounting. The components can exhibit static and/or time-varying components that are often complex. For example, each point at which the optical element is contacted by a mounting may result in translational and/or rotational stresses corresponding to one or more of the six degrees of freedom (6 DOFs) being applied to the element. The resulting complex strains and deformations may extend over substantial portions of the optical element from the points of contact.

Therefore, there is a need for improved mountings for optical elements, especially for use in high-performance optical systems.

SUMMARY

The foregoing need is satisfied by optical-element mountings, and optical systems comprising same, as disclosed herein.

A first aspect of the disclosure is directed to clamps for holding optical elements relative to a support. An embodiment of such a clamp comprises a first arm, a second arm, and a member connecting together the first and second arms, such that a respective portion of a mounting feature of the optical element to be held by the clamp is inserted between the first and second arms. The first arm applies a clamping force directed to the respective portion of the mounting feature, and the second arm comprises a seat having at least an upper portion and an intermediate portion (also called a "waist" portion). The upper portion is engaged with the respective location on the mounting feature, and the intermediate portion is situated between the upper portion and the second arm. In the manner of a waist, the intermediate portion has a lateral thickness (e.g., diameter) less than the lateral thickness (e.g., diameter) of the upper portion. The intermediate portion exhibits elastic and plastic deformability so that a moment applied by the clamp to the mounting feature is limited to less than a designated peak moment, while maintaining substantially full engagement of the upper portion with the respective location.

The clamp can further include a mounting that couples the clamp to the support. The mounting constrains at least one degree of freedom (DOF) of motion of the clamp relative to the support. Multiple clamps desirably constrain multiple DOFs. The clamps desirably collectively provide the optical element with a substantially kinematic mounting to the support. In a substantially kinematic mounting, the clamps collectively constrain a total of six DOFs (x, y, z, $\theta_x$, $\theta_y$, $\theta_z$).

The seat desirably is made of a ductile metal. Candidate metals include, but are not limited to, mild steel, stainless steel, invar, aluminum alloy, and copper alloy.

According to another aspect, optical systems are provided. An embodiment of such a system comprises a frame, an optical element, at least one clamp, and a respective mounting. Each clamp applies a respective clamping force to a respective location on a "mounting feature" (see below) of the optical element to hold the optical element relative to the frame. Each mounting couples the respective clamp to the frame and constrains at least one respective DOF of motion of the optical element relative to the frame. The mountings desirably comprise flexures that provide flexibility in at least one DOF. Each clamp comprises a respective seat having at least an upper portion and an intermediate (waist) portion (and desirably a base portion). The upper portion is engaged with the respective location on the mounting feature, and the intermediate portion is situated between the upper portion and the clamp. The base portion (if present) is situated between the clamp and the intermediate portion and couples the seat to the clamp. The intermediate portion has a lateral thickness (e.g., diameter) that is less than the lateral thickness of the upper portion. The intermediate portion exhibits elastic and plastic deformability that are sufficient for any moment applied by the clamp to the mounting feature to be limited to less than a designated peak moment, while maintaining substantially full engagement of the upper portion with the respective location.

The "optical element" can be any of various optical elements including, but not limited to, refractive optical elements and reflective optical elements. An example of a refractive optical element is a lens; an example of a reflective optical element is a mirror. Other possibilities include gratings, optical plates, windows, etc.

In substantially all situations from a practical standpoint, the designated peak moment is less than a maximum allowable moment for the mounting feature of the optical element. The maximum allowable moment is, for example, a moment that otherwise would cause fracture or other permanent damage to the mounting feature. Usually, such damage to the mounting feature results in permanent damage to the optical element. But the maximum allowable moment need not be set so high. In high-performance optical systems, the maximum allowable moment may be a moment beyond which the optical element exhibits deviant optical performance that, for example, cannot be readily corrected.

The "frame" can be an optical column, optical "barrel," or the like, to which the one or more optical elements of the optical system are mounted and supported relative to each other and relative to other structure of the lithographic optical system. The "mounting feature" can be configured as a flange, a plate, a projection, one or more mounting tabs, or other structure of the optical element that actually contacts the clamp as the clamp holds the optical element. The mounting feature need not be a separate structure (such as a tab or flange) of the optical element but rather can be simply a region or regions (e.g., regions in a peripheral zone of the optical element) that can be attached to or engaged with the clamp. The mounting feature can also be a structure bonded to the optical element by, e.g., adhesive, optical contact, or other means.

Many embodiments include multiple clamps. Each clamp applies a respective clamping force to a respective location on the mounting feature. Each clamp is coupled to the frame by at least one mounting, and each mounting can comprise at least one flexure providing flexibility in at least one DOF. Each clamp comprises a seat, as summarized above. The seat engages a respective location on the mounting feature, such as the under-surface of a respective mounting tab. The special properties of the seats enable the clamps to accommodate manufacturing and/or assembly tolerances in the optical element, for example, such as angular tolerances or planarity tolerances of the mounting feature, without exceeding a designated peak moment.

By way of example, the mounting feature comprises three mounting tabs arranged around the periphery of the optical element. A respective clamp (each including a seat) is provided for each mounting tab. Desirably, the multiple mountings collectively provide a substantially kinematic mounting, as defined elsewhere herein, of the optical element to the frame. The clamps with their respective seats prevent the respective mounting features (or portions thereof) from experiencing more than a predetermined stress level during assembly, shipment, and use.

According to yet another aspect, lithography systems are provided that comprise a stage for holding and moving an object, and an optical system situated relative to the stage and configured to direct an energy beam to or from the object on the stage. The optical system is generally as summarized above. By way of example, the stage can be a reticle stage, wherein the object is a reticle or mask, and the optical system is an illumination-optical system or a projection-optical system. In another example, the stage is a substrate stage, the object is a lithographic substrate, and the optical system is a projection-optical system.

According to yet another aspect, methods are provided for mounting to a frame an optical element having a mounting feature. An embodiment of such a method comprises coupling multiple clamps to the frame using respective mountings situated between the clamps and the frame. As summarized above, each mounting constrains at least one respective DOF of motion of the respective clamp relative to the frame. The method includes mounting the optical element to the clamps by engaging respective locations on the mounting feature with respective seats of respective clamps. The method includes configuring each seat at least with an intermediate portion and an upper portion. The upper portion engages the respective location on the mounting feature. The intermediate portion is situated between the upper portion and the frame. The intermediate portion has properties as summarized above. Each clamp is caused to apply a respective clamping force to the respective location on the mounting feature to hold the optical element relative to the frame. Before mounting the optical element to the clamps, an assembly fixture can be placed relative to the frame to support the clamps relative to the frame. The assembly fixture is removed after causing the clamps to apply their respective clamping forces. The seats are particularly suitable for substantially decreasing or eliminating stresses to the mounting feature during the time the assembly fixture is in place, and also for substantially reducing stresses that may exist after removing the assembly fixture. The seats advantageously exhibit both elastic and plastic deformation as required during the time the assembly fixture is in place, and elastic deformation as required after the assembly fixture is removed.

As noted, in exemplary embodiments, the seat is made of a suitably ductile metal, wherein the intermediate portion has less diameter (or other lateral thickness) than the upper portion. If the seat has a base portion, the base portion can have a flange-like configuration for mounting to the clamp (but such a base portion is not required). Being ductile and being of lesser diameter or thickness than the upper portion, the intermediate portion can bend in an elastic manner as well as a plastic manner to allow the seat to accommodate variations and tolerances (which tend to be very small in high-performance optical systems) in planarity and other geometrical parameters of the optical element, while maintaining substantially full contact of the upper portion with the respective mounting feature or location on the mounting feature. The degree of this deformation actually experienced by the intermediate portion is normally very small. But, it nevertheless substantially reduces stress that otherwise would or could be imparted to the mounting feature by the clamp, either during assembly of the optical system or afterward such as during use of the optical system. Thus, in the subject optical systems, the optical element being held by such a mounting is substantially less susceptible to generation or accumulation of excess stress that otherwise may adversely affect the optical performance of the optical element.

The foregoing and additional features and advantages of the invention will be more readily apparent from the following detailed description, which proceeds with reference to the accompanying drawings.

BRIEF DESCRIPTION OF THE DRAWINGS

FIG. 2(D) is similar to FIG. 2(C), but including an assembly fixture that holds the clamp in position during assembly of the optical element to the clamp.

FIG. 2(E) is similar to FIG. 2(D), but wherein the clamp has a seat that is not parallel to the under-surface of the mounting feature, causing a stress concentration ("stress conc") when the seat is urged against the mounting feature.

FIG. 3 is a side elevational view of a clamp coupled to at least one flexure and having a long, thin seat.

DETAILED DESCRIPTION

The invention is described below in the context of representative embodiments that are not intended to be limiting in any way.

General Considerations

As used in this application and in the claims, the singular forms "a," "an," and "the" include the plural forms unless the context clearly dictates otherwise. The term "includes" means "comprises." The term "coupled" encompasses mechanical, electrical, electromagnetic, or optical coupling or linking and does not exclude the presence of intermediate elements situated between the coupled items.

In the following description, certain terms may be used such as "up," "down," "upper," "lower," "horizontal," "vertical," "left," "right," and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object.

Figure 1A:
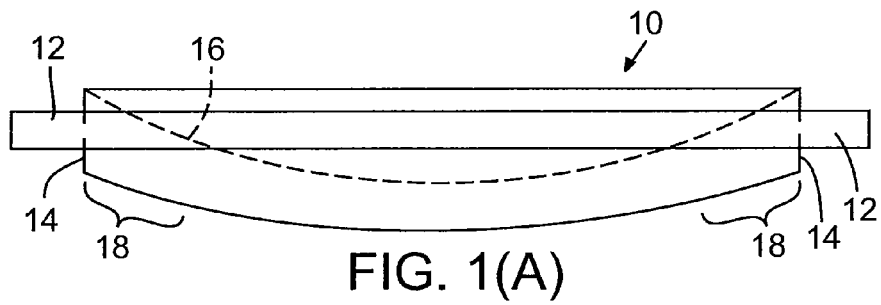
FIG. 1(A) is a side elevational view of an optical element having a circumferential mounting flange as an exemplary mounting feature.
Figure 1B:
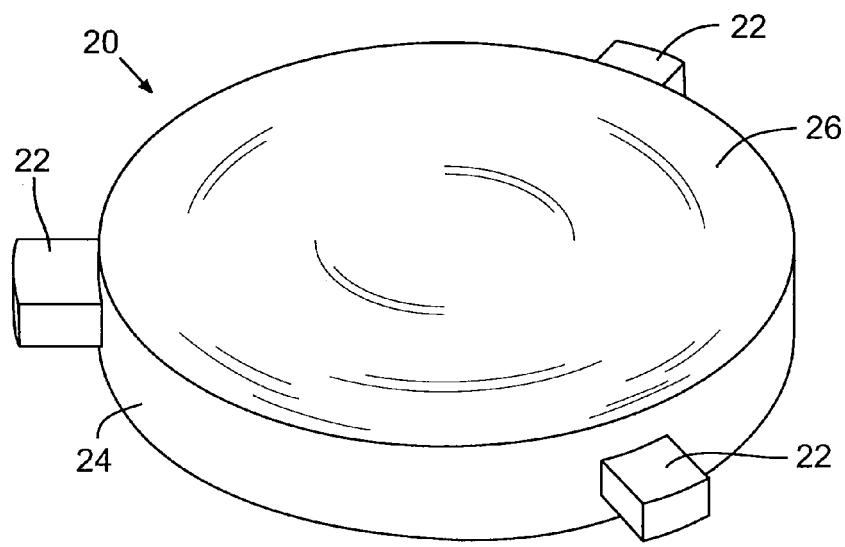
FIG. 1(B) is a perspective view of an optical element having multiple (three in this embodiment) mounting tabs extending from a side surface, as an exemplary mounting feature.
Figure 1C:
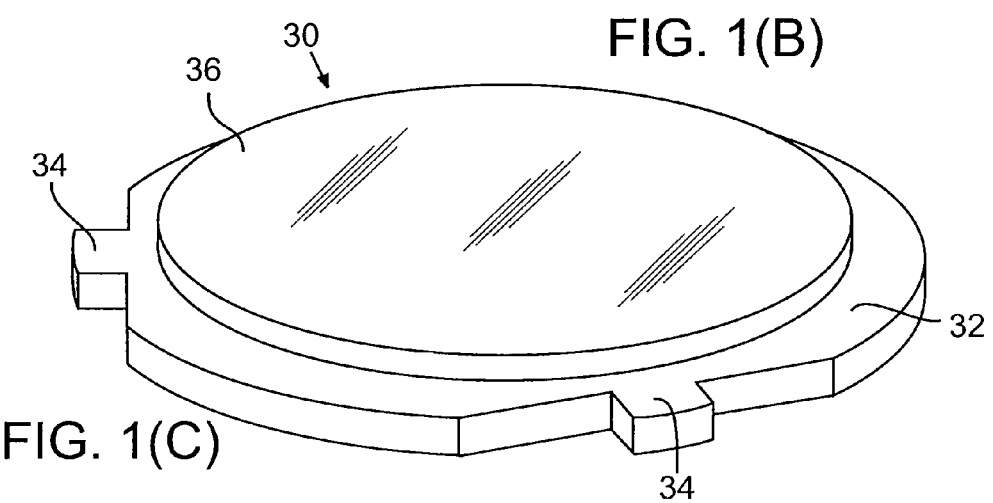
FIG. 1(C) is a perspective view of an optical element having both a mounting flange and mounting tabs as exemplary mounting features.

FIG. 1(A) shows an optical element 10 as an example optical element adapted to be supported by a mounting. The optical element 10 can be refractive or reflective, planar or not planar, circular profile or other shape. The depicted optical element 10 includes a circumferential flange 12, as an exemplary mounting feature, extending from a peripheral edge 14 of the element. The optical element 10 also includes an optical surface 16 and a peripheral region 18. The flange 12 can be useful in localizing clamping stress and/or other stresses applied to the optical element and thus can substantially reduce optical deformation of the element from application of mechanical clamping force. For mounting the optical element 10, one or more clamps (not shown, but discussed later below) can be used that engage respective regions of the flange 12. As another example, FIG. 1(B) shows an optical element 20 that includes, as an exemplary mounting feature, multiple mounting tabs 22 extending from a peripheral edge 24 of the element. The element 20 has an optical surface 26. For mounting the optical element 20, respective clamps (not shown, but discussed later below) are used that engage the mounting tabs 22, at least one clamp per mounting tab. FIG. 1(C) depicts yet another optical element 30 comprising, as exemplary mounting features, both a flange 32 and mounting tabs 34. The optical surface 36 faces upward in this figure. For mounting the optical element 30, respective clamps (not shown, but discussed later below) are used that either engage respective mounting tabs 34 and/or engage respective regions on the flange. In the following description, it will be understood that clamps configured to engage respective mounting tabs are generally capable of engaging respective locations on a mounting flange, and vice versa.

Figure 2B:
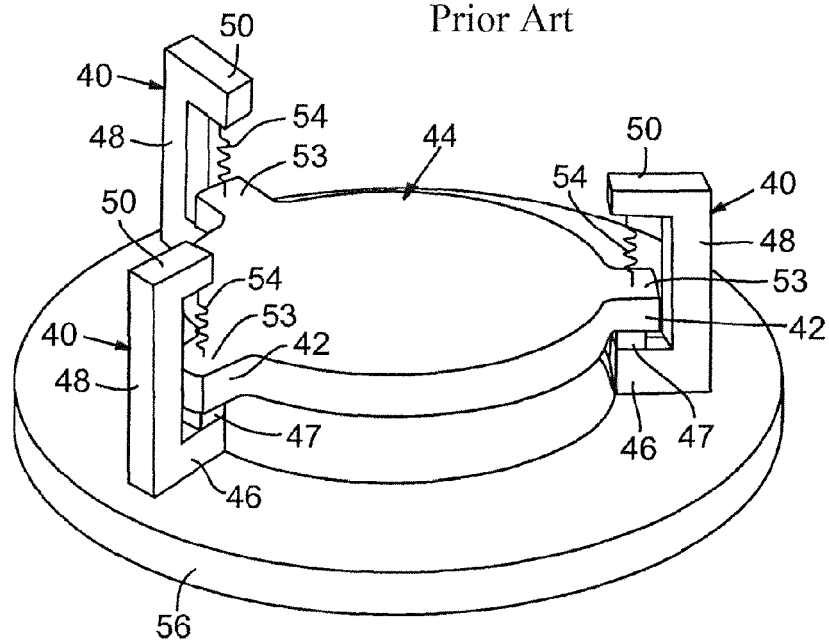
FIG. 2(B) is a perspective view of an optical element being held by three conventional "C"-type clamps coupled to a frame.
Figure 2A:
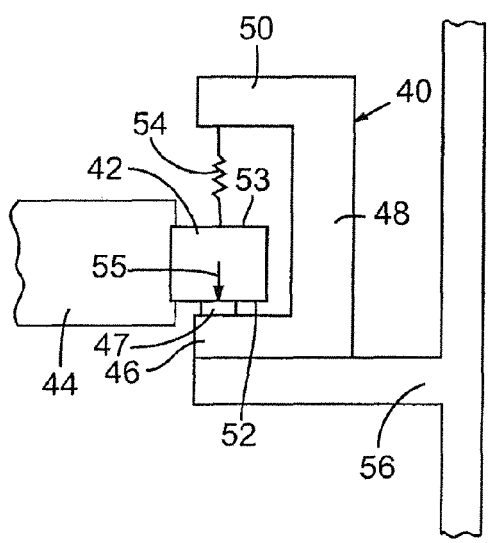
FIG. 2(A) is a side elevational view of a conventional "C"-type clamp engaged with a mounting tab of an optical element.

In FIG. 2(A) a conventional clamp 40 is shown, engaged with a mounting tab 42 of an optical element 44. The clamp 40 is configured generally as a conventional "C-clamp" having a first arm 46, a body 48, and a second arm 50. Mounted to or associated with the first arm 46 is a seat 47. The bottom surface 52 of the mounting tab 42 is urged (vector 55) against the seat 47 by spring force 54 applied, relative to the second arm 50, to the upper surface 53 of the mounting tab. The clamp 40 is mounted to a frame 56 that serves as, for example, a support structure for an optical system including the optical element 44. If the optical system comprises one or more additional optical elements (not shown), the additional element(s) are usually also mounted to the frame 56.

In FIG. 2(B) the optical element 44 is shown, mounted to the frame 56 using three clamps 40. The optical element 44 has three mounting tabs 53 extending outward from the periphery of the optical element in a manner similar to FIG. 1(B). The optical element 44 is circular, and the mounting tabs 53 are oriented approximately 120° (equi-angularly) apart. The optical element 44 is held relative to the frame 56 by the clamps 40 engaged with respective mounting tabs 53. The first arm 46 of each clamp 40 includes a respective seat 47 on which the mounting tab 53 rests. Means by which the clamps apply clamping force to the mounting tabs 53 are represented by respective springs 54.

In the mounting configurations shown in FIGS. 2(A) and 2(B) the optical element 44 is over-constrained. More specifically, the clamps 40 are not movable relative to the frame 56, and the seats 47 are rigid and are either poorly or substantially non-conforming to the mounting tabs 53, essentially out-of-plane or mis-aligned mounting tabs. This over-constraint can impart substantial stress to the clamped mounting tabs 53, and the stress may extend into the optical element 44 itself. Additional stresses can arise from tolerances and imperfections, associated with manufacture and assembly of the clamps 40 and frame 56, causing the seats 47 to be not exactly coplanar. Similarly, tolerances and imperfections in the mounting tabs 53 may cause them to be not exactly coplanar. Applying clamping force 54 to the mounting tabs 53 in these circumstances can over-stress the optical element by application of large stresses to the tabs.

Figure 2C:
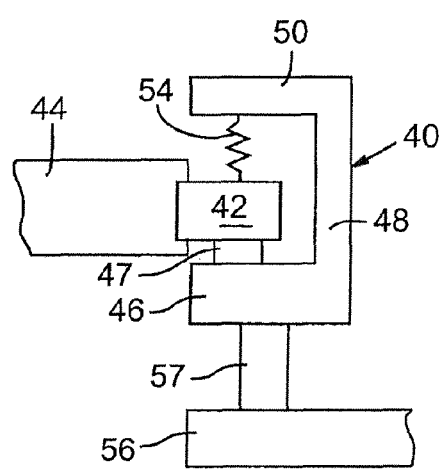
FIG. 2(C) is a side elevational view of a conventional "C"-type clamp including at least one flexure coupling the clamp to a frame.

An approach to reducing this stress is to couple the clamps 40 to the frame 56 using mountings that provide the clamps with some flexibility in at least one degree of freedom (DOF) of motion relative to the frame while constraining motion of the clamp in at least one DOF relative to the frame. An example arrangement is shown in FIG. 2(C), showing one clamp 40 and a flexure 57 situated between the first arm 46 of the clamp and the frame 56. One or more flexures can be used with each clamp. The flexures 57 provide at least some flexibility of the clamps relative to the frame to prevent over-constraint of the optical element. The flexures 57 collectively can be configured as a substantially kinematic mounting or quasi-kinematic mounting for the optical element. Desirably, each clamp constrains at least one DOF of the optical element, and the combination of the three clamps constrains six DOFs of the optical element.

No clamp mounting is perfectly kinematic. If there is a parallelism mismatch between the mounting tab 53 and the seat 47, for example, some moment is required to rotate the clamp's kinematic mounting to conform to the tab. This moment is transmitted to the optical element 44, which can cause optical problems (e.g., distortion, stress birefringence, etc.) A kinematic mounting desirably is compliant ("soft") in the rotational degrees of freedom ($\theta_x$, $\theta_y$, $\theta_z$), but the achievable compliance is usually a compromise limited by the required stiffness in the constraining axes (x, y, z), the space available, and the required flexure strength.

If the flexures 57 are highly compliant, they likely will require temporary support during assembly of the optical element 44 to the clamps 40. Such temporary support can be provided using an assembly fixture or jig to hold the clamps relative to the frame 56. An example is shown in FIG. 2(D), showing an assembly fixture 60 situated relative to the frame 56 and holding a clamp 40 in an assembly position. The flexure 57 is situated between the clamp 40 and the frame 56.

Use of an assembly fixture 60 may prevent the seats 47 from fully conforming to the mounting tabs 42 when the clamping forces 54 are applied, which can cause stress concentration in the mounting tabs. An example is shown in FIG. 2(E), in which the seat 47 has an upper surface 62 that is not parallel with the under-surface of the mounting tab 53. Since only a portion 64 of the upper surface 62 contacts the mounting tab 53, excess clamping stress is concentrated ("stress conc") in the mounting tab. The resulting moment(s) applied to the mounting tabs can distort the optical element 44. The moments also can cause damage to the optical element 44 if it is made of a fragile material such as calcium fluorite ($CaF_2$). After completing assembly and removing the assembly fixture 60, the flexures 47 allow the clamps 40 to move slightly and at least partially relieve the moments, but damage may already be done.

Figure 4:
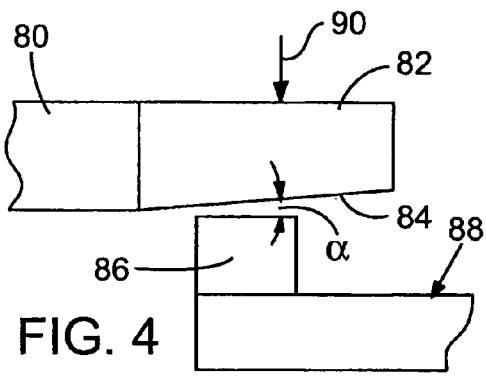
FIG. 4 is a side elevational view of a mounting tab situated relative to a conventional mounting seat, showing an example mis-parallelism of the mounting tab relative to the surface of the mounting seat.

A situation similar to that in FIG. 2(E) is shown in FIG. 4, which shows a portion of an optical element 80 and a mounting tab 82 thereof. Note that the lower surface 84 of the mounting tab 82 is not parallel to the upper surface of the seat 86 of the clamp 88, but rather is at an angle $\alpha$ relative to the upper surface. The angle $\alpha$, desirably zero, is not zero in this example as a result of manufacturing tolerances. If the tab 82 were placed on the seat 86 and if a vertically downward force 90 were applied in an effort to urge the lower surface 84 of the tab into full contact with the upper surface of the seat, the tab would be subjected to a moment that would produce substantial stress in the tab and elsewhere in the optical element 80.

To address situations discussed above, the Applicants directed attention to the clamp seats. For comparison purposes, in FIGS. 2(A)-2(E) discussed above, the depicted seat 47 has a transverse profile that is square or circular. The seat 47 also has a shallow height (vertical thickness) that is sufficient for defining its contact area but is typically shorter than its width. Such a seat 47 was found to be unsatisfactory because, inter alia, despite having good vertical stiffness it had insufficient angular compliance to conform to the under-surface of the mounting tab 42; i.e., it had little to no ability to accommodate the situation shown in FIG. 2(E) or FIG. 4, for example. Applicants then considered a seat 62 that is narrow and/or long (FIG. 3) to provide the desired angular compliance. Unfortunately, a seat 62 having a small cross-sectional area and/or excessive length has insufficient z-direction stiffness as well as insufficient angular stiffness for holding the optical element.

A new seat configuration was derived that provides, for optical-element mounting purposes, a desired combination of vertical (z-direction) stiffness and elastic and inelastic angular compliance. Inelastic compliance is provided by making the new seat of a ductile metal and by appropriate control of its geometry. Ductility is important because, if the seat were otherwise configured so that bending is always elastic over the range of angles ($\alpha$; FIG. 4), then the seat would have to have a small diameter or relatively long length (FIG. 3) to prevent: (1) bending stresses resulting in yield of the seat, (2) local contact stresses that exceed the strength of the mounting feature of the optical element, or (3) moments of sufficient magnitude to damage the mounting feature. But, as noted above, a seat that is too long and narrow is unsatisfactory; it has an increased range of elastic deformation, but the tradeoff is excessive loss of angular stiffness and stiffness in the z-direction.

Making the new seat of a ductile metal allows the seat, for purposes of holding an optical element, to deform and yield without fracture. Ductility also ensures that the new seat can accommodate an anticipated range of angles ($\alpha$ in FIG. 4), while maintaining substantial contact with the respective location on the mounting feature. Example ductile metals include, but are not limited to, mild steel, stainless steel, invar, aluminum alloy, copper alloy, and titanium alloy.

Because some of the deformability of the new seat is elastic, there is some residual moment being applied to the optical element when clamped and while an assembly fixture 60 is in place. But, when the assembly fixture is removed, the seat "springs back" to relieve some of its elastic stress as the flexure(s) coupling the clamp to the frame allow the clamp to rotate. The new seat configuration also does not interfere with the ability of the mounting to tolerate stresses arising after assembly, such as during shipping, set-up, and use of the optical system, without further inelastic deformation that could change the positioning and alignment of the optical element.

A key aspect of the new seat is that it avoids exceeding the stress limit of the mounting tab or other mounting feature of the optical element, both during assembly and afterward. To such end, the new seat has respective regions of larger diameter (i.e., an "upper portion") and smaller diameter (i.e., an intermediate or "waist" portion), with reduced overall length (including of the intermediate portion), to provide, inter alia, higher compression stiffness (stiffness in the z-direction). The seat is made of a ductile metal having a relatively high Young's modulus and relatively low yield strength. The relatively high Young's modulus yields improved compression stiffness of the seat, which is advantageous for holding the optical element precisely and without vibration. The relative low yield strength limits the peak moment that can be applied via the seat to the optical element. If bending stresses are encountered that exceed the yield strength of the seat, the intermediate portion of the seat can continue bending with a small increase in the bending moment, while the upper portion remains in substantially full contact with the mounting tab or other mounting feature. Hence, the seat can deform inelastically and take a "set" according to the mounting feature to which the seat is engaged. Maintaining substantially full contact of the seat with the mounting feature is important because space constraints and other considerations often require that mounting tabs or other mounting features be as small and/or narrow as possible.

Figure 5A:
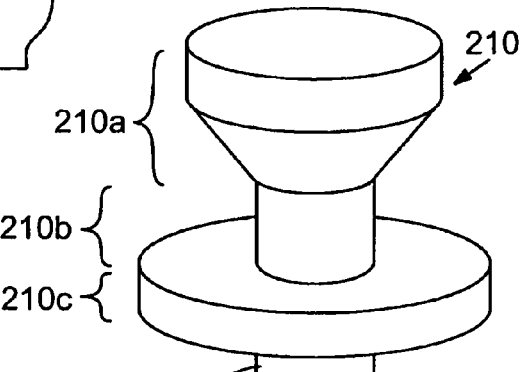
FIG. 5(A) is a perspective view of a first representative embodiment of a mounting seat.

A first representative embodiment of a seat 210 is depicted in FIG. 5(A). The seat 210 desirably is fabricated as a single unit. The seat 210 includes an upper portion 210a, an intermediate portion (or "waist") 210b, and (in the depicted embodiment) a base portion 210c. The base portion 210c can include a pin 210d or analogous feature used for mounting the seat 210 to a particular location on a clamp. (The details of the base portion 210c are not important to the configurations of the intermediate portion 210b and upper portion 210a, and may vary depending upon the particular manner in which the seat is integrated with the clamp.) The intermediate portion 210b has less diameter than the upper portion 210a. (Desirably, if present, the base portion 210c has a greater diameter than the intermediate portion 210b.) The "waist" provided by the lesser diameter intermediate portion 210b is advantageous. The diameter of the intermediate portion 210b determines both the moment of elastic deformation and the maximum moment for fully inelastic deformation. The intermediate portion 210b also has sufficient length (but desirably not more than sufficient length) so that the seat does not fail or crack at the maximum angle α that the seat must accommodate.

In many embodiments the intermediate portion 210b has approximately the same height (z-direction length) as its lateral thickness (diameter), i.e., the ratio of length to width of the intermediate portion in these embodiments is approximately 1:1. The bending moment to reach the elastic limit of the intermediate portion is determined by the diameter of the intermediate portion. If the intermediate portion 210b were made substantially shorter than the 1:1 ratio, then the seat (for a given angle α) would exhibit more plastic deformation, which is not desirable. Therefore, the intermediate portion desirably is short, but not too short. The exact desirable ratio will depend, at least in part, on the material from which the seat is fabricated. An example ratio of the lateral thickness (diameter) of the upper portion 210a to the intermediate portion 210b is in the range of 2 to 4.

Another consideration in establishing the diameter of the intermediate portion 210b is the expected conditions the optical system will experience after assembly. If the optical system is assembled using an assembly fixture, the diameter of the intermediate portion 210b is determined so that, after the assembly fixture is removed, the remaining stresses being applied by the clamps to the optical element do not exceed the elastic limit in the seats. Otherwise, the positioning and alignment of the optical element in the system may change too much during shipment and use.

As noted above, the diameter of the intermediate portion 210b is selected based on the maximum moments that can be tolerated by the optical element and/or its mounting feature(s). The diameter is also selected based on the required strength of the seat after removal of the assembly fixture (if used). The length is selected so that the intermediate portion 210b (or any other part of the seat) does not fail over the range of angles α. Thus, the seat can elastically deform over a larger range of angles before it exhibits yield.

As noted, the seat 210 desirably is made of a single material. In alternative embodiments, the seat 210 is made of multiple components. An example embodiment includes an upper portion 210a made, for example, of a relatively non-ductile metal, while the intermediate portion 210b is made of a relatively ductile metal.

Whereas a conventional mounting for an optical element does not exhibit significant yield, the seat 210 desirably exhibits plastic deformation whenever its yield point is exceeded. Exceeding the yield point may occur, for example, during clamping while the clamps are being held by an assembly fixture. During this time, although the seats 210 exhibit plastic deformation as required to conform to the mounting features of the optical element, the seats do not fracture. In other words, the seats can exhibit plastic deformation to accommodate, without fracturing, stresses exceeding their elastic limit. After mounting the optical element to the clamps, the assembly fixture is removed. At that moment, the flexure(s) or analogous mountings of the clamps (desirably providing substantially kinematic or quasi-kinematic mountings) reduce moments being applied to the seats, allowing stresses in the seats to drop below the elastic limit of the seats. Even though the seats may have previously undergone plastic deformation, the seats now are in their "elastic" range of strain, in which the mountings are stable. Thus, the seats yield as required during assembly, but do not yield after assembly, such as during shipping or operation. Seat stress (and hence stress to the optical element) is relieved during assembly, and does not appear after assembly.

As noted, the lateral thickness (e.g., diameter) of the intermediate portion 210b is less than the diameter of the upper portion 210a. If present, the base portion 210c desirably has greater lateral thickness (e.g., diameter) than the intermediate portion 210c. By having a narrower intermediate portion 210b, the upper portion 210a can maintain, without exhibiting any significant deformation, substantially full contact with the respective mounting feature of the optical element within the range of angles α that may be encountered. The upper portion 210a maintains angular conformability with the mounting feature without the seat 210 having to undergo significant displacement in the z-direction.

It will be understood that, in the embodiment of FIG. 5(A), any or all the abrupt edges and corners shown can be radiused to provide relief. It is also pointed out that the inverted frustoconical portion of the upper portion 210a shown in FIG. 5(A) is not intended to be limiting. For example, the intermediate portion 210b can transition directly into the upper portion 210a without the frustoconical portion being present.

Figure 5B:
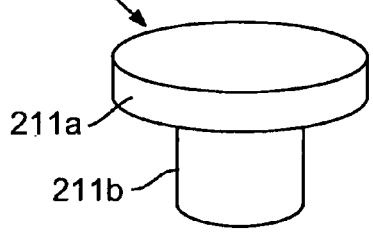
FIG. 5(B) is a perspective view of a second representative embodiment of a mounting seat.

An alternative embodiment 211 is shown in FIG. 5(B), in which the upper portion 211a is simply a larger-diameter disk, and the intermediate portion 211b has a smaller diameter. Note that the intermediate portion 211b in this embodiment desirably has, for reasons as discussed above with respect to the embodiment of FIG. 5(A), a diameter that is approximately equal to the length of the intermediate portion 211b. A base portion (not shown) can be included if desired or required.

Figure 6:
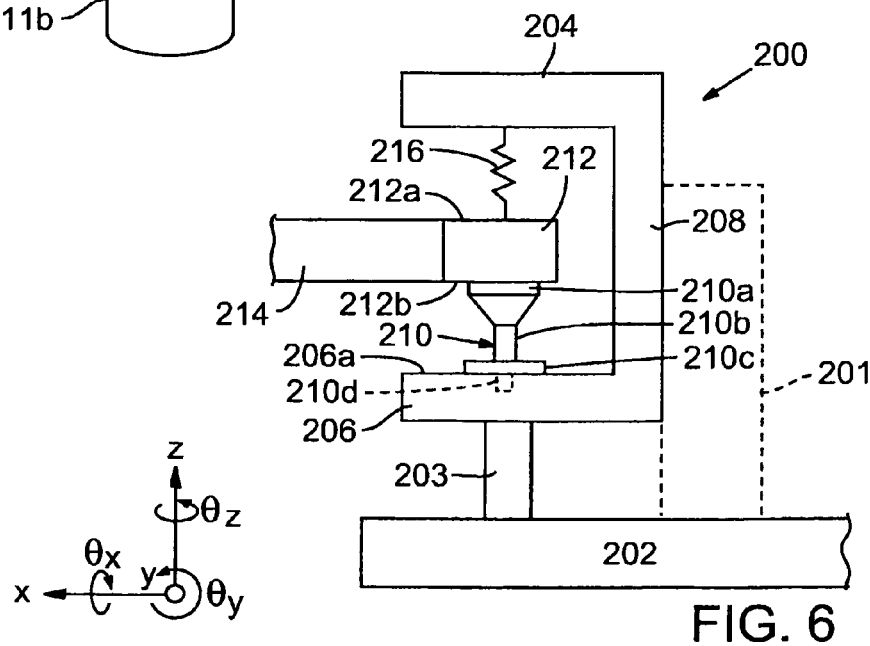
FIG. 6 is a side elevational view of a mounting tab being supported by a seat according to the embodiment of FIG. 5(A).

Referring now to FIG. 6, a clamp 200 is mounted to a frame 202 by at least one flexure 203 or analogous mounting such that the clamps collectively provide a kinematic or quasi-kinematic mounting of the optical element 214 to the frame. Also shown is an assembly fixture 201. The clamp 200 comprises a first arm 204, a second arm 206, and a connecting member 208. In this regard, the clamp 200 can have a "square-C" configuration as shown. Alternatively, the clamp 200 can have a "rounded-C" configuration or other configuration having the arms 204, 206 and member 208. The clamp 200 also comprises an embodiment of a conformable seat 210 (as shown in FIG. 5(A)) mounted to the second arm 206. The seat 210 is situated to engage a mounting tab 212 or other mounting feature of an optical element 214. The mounting tab 212 is urged against the seat 210 by clamping force (the means for applying the force is represented by a spring 216 or the like) extending downward from the first arm 204 applied against the upper surface 212a of the tab. Meanwhile, as discussed above, the seat 210 limits the moment applied thereby to the mounting tab 212 during assembly.

As in the embodiment of FIG. 5(A), the seat 210 in this embodiment includes an upper portion 210a, a thinner (compared to the upper portion) intermediate portion 210b, and a base portion 210c. The upper portion 210a engages the lower surface 212b of the mounting tab 212, and the base portion 210c of the seat is mounted to the upper surface 206a of the second arm 206 (using, for example, the mounting pin 210d). At least the intermediate portion 210b of the seat 210 is flexible to allow the seat to conform as necessary to accommodate, for example, a mis-parallelism (α) of the lower surface 212b of the tab 212 relative to the upper surface 206a of the second arm 206 (FIG. 4)). The intermediate portion 210b has flexibility in the $\theta_x$ and $\theta_y$ dimensions, thereby providing the seat 210 with flexibility in $\theta_x$ and $\theta_y$ (also called "angular flexibility").

The seat is configured and dimensioned to accommodate a maximum allowable bending moment for the optical element under defined conditions while limiting the moment applied thereby to the optical element. The maximum allowable bending moment can be determined by conducting moment studies of the mounting tab 212 (or mounting flange or the optical element itself), based on required clamping forces and typical tolerance build-up, to determine the maximum allowable moment the clamp will be allowed to impart without exceeding the specified stress limit of the mounting tab. An example tolerance error is denoted by the angle α in the mounting tab shown in FIG. 4. In other words, a maximum moment is determined and applied, the corresponding stresses are calculated, and the results are scaled appropriately.

Figure 7:
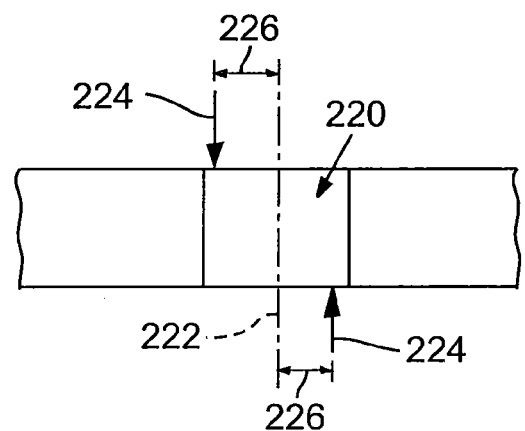
FIG. 7 is an elevational diagram showing offset forces being applied to a mounting tab.

In one study, the maximum allowable moment was found by conducting a tab-moment study with clamp-force loads being applied at 0.5-mm incremental displacements from the central axis of the tab. The 0.5-mm increments were arbitrarily selected to simulate the tolerance build-up and/or clamp-flexure bending. (Offset forces can be used in finite-element analysis (FEA) to obtain accurate results without creating local moment deformations.) At a specific distance from the central axis, the tensile yield stress in the tab reached the stress limit. The maximum allowable moment was defined from: (clamping force [N])×(offset distance that generates the greatest stress that is ≦stress limit [mm])=maximum allowable moment [N·mm]. See FIG. 7, depicting an end view of a mounting tab 220 and the axis 222 of the mounting tab. Clamping force is denoted by the arrows 224, and the axial offset distance 226 is shown.

Figure 8:
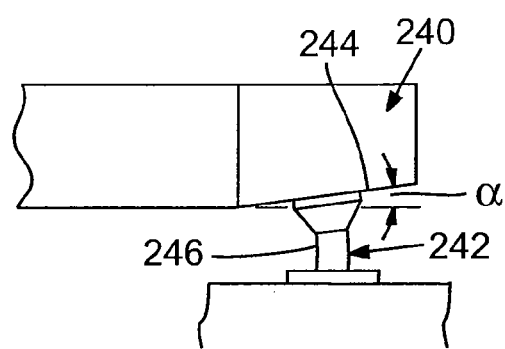
FIG. 8 shows the mounting seat of FIG. 5(A) exhibiting a bending deformation as a result of a moment being applied to it.

FIG. 8 depicts an embodiment of the seat 242 of FIG. 5(A) engaged with a mounting tab 240 having a lower surface 244 at an angle α relative to horizontal. Application of clamping force to the mounting tab 240 causes bending of the intermediate portion 246 of the seat 242.

Assuming a certain range of angle through which the seat is expected to conform (from the tab tolerances and clamp-flexure bending under load), the diameter and length of the intermediate portion of the seat are determined, based on the clamping force and the maximum moment deemed to be allowable to the mounting feature of the optical element.

The following example is provided, but is not intended to be limiting in any way.

EXAMPLE

In this example, a series of tests was performed under conditions in which tolerances of the mounting tabs were: parallelism at both width and thickness: 2.5 μm; flatness at all faces: 0.25 μm. Clamping force (maximally 436 N) at an axial offset of 2.5 mm applied to the mounting tabs produced the maximum allowable moment of (clamping force)×(offset)= (436 N)(2.5 mm)=1090 N·mm. Under these conditions, the tensile yield stress in the tab reached a 27 MPa limit. Also, the maximum angular displacement of the tab was $\theta=9.9\times10^{-4}$ rad.

Assuming a worst-case scenario in which the seat completely yields, the moments created by the clamp seat were calculated to assure that the maximum allowable moment for the mounting tabs was not exceeded. In this example, clamp seats made of 304 stainless steel were evaluated. For this material, the yield stress ($\sigma_y$) is 215 N/mm², the maximum allowable moment (M) is 1090 N·mm, and Young's modulus (E) is $2\times10^5$ N/mm². According to the beam equation:

$$\sigma = \frac{My}{I} \qquad (1)$$

where I is the second moment of area (which, for a cylindrical rod is $(\pi/64)(d^4)$) and y=d/2, where d is diameter. Hence, $$\sigma = \frac{32M}{\pi d^3} \qquad (2)$$

and $$d = \left[\frac{32M}{\pi \sigma}\right]^{1/3} \qquad (3)$$

If M=1090 N·mm, d=3 mm, and σ=215 N/mm², then d=3.7 mm. With respect to compression, $\sigma_c=F/A$, where F=2× (clamping force) and $A=(\pi/4)d^2$. Thus, $$\sigma_c = \frac{4F}{\pi d^2} \qquad (4)$$

and $$d = \left[\frac{4F}{\pi \sigma}\right]^{1/2} \qquad (5)$$

With F=2(436 N)=872 N and σ=215 N/mm², d=2.3 mm. Therefore, a diameter of 3 mm was considered.

At d=3 mm, and using Equations (1) and (2), the maximum stress is:

$$\sigma = \frac{My}{I} = \frac{32M}{\pi d^3} = \frac{32(1090\ \text{N}\cdot\text{mm})}{\pi(3\ \text{mm})^3} = 411\ \text{N/mm}^2 \qquad (6)$$

If $$\theta = \frac{Ml}{EI} = \frac{Ml}{E\left(\frac{\pi d^4}{64}\right)} = \frac{64Ml}{E\pi d^4},$$

where l is the length of the intermediate portion of the seat, then $$l = \frac{E\pi d^4 \theta}{64M} \qquad (7)$$

So, in this example, $$l = \frac{(2\times 10^5\ \text{N/mm}^2)\pi(3\ \text{mm})^4(9.9\times 10^{-4}\ \text{rad})}{64(1090\ \text{N}\cdot\text{mm})} = 0.72\ \text{mm}$$

By the intermediate portion of the seat being configured with a length longer than 0.72 mm, the seat can be made to conformably bend in response to moments less than the maximum allowable moment of 1090 N·mm. In this example, intermediate-portion lengths of 2 mm, 2.5 mm, and 3 mm were considered. Also considered were intermediate-portion diameters of 2.5 mm and 3 mm. In the following, M was determined by:

$$\theta = \frac{Ml}{EI} = \frac{64Ml}{E\pi d^4} \quad (8)$$

Thus, $$M = \frac{\theta E \pi d^4}{64 l}. \quad (9)$$

Stress (σ) was calculated as the sum of stress ($\sigma_{BM}$) arising from a bending moment and stress ($\sigma_c$) arising from compression of the intermediate portion of the seat, where (from Equation (2)):

$$\sigma_{BM} = \frac{My}{I} = \frac{32M}{\pi d^3}, \text{ and} \quad (10)$$

$$\sigma_c = \frac{F}{A} = \frac{4F}{\pi d^2}. \quad (11)$$

Thus, $$\sigma = \sigma_{BM} + \sigma_c. \quad (12)$$

From the above, the following data were obtained:

TABLE 1

| d | l | M | σ |
|---|---|---|---|
| 2.5 mm | 2 mm | 189.8 N · mm | 301 N/mm² |
| 3 mm | 0.72 mm | 1090 N · mm | 411 N/mm² |
| 3 mm | 2 mm | 393.6 N · mm | 271.9 N/mm² |
| 3 mm | 2.5 mm | 314.9 N · mm | 242.2 N/mm² |
| 3 mm | 3 mm | 262.4 N · mm | 222.4 N/mm² |

Note that, for d=2.5 mm or 3 mm and l=2 mm, 2.5 mm, and 3 mm, each of the stress values was greater than the yield stress $\sigma_y$ for 304 stainless steel (215 N/mm²).

As discussed previously, the clamps desirably are collectively mounted in a kinematic or quasi-kinematic manner. To such end, each clamp is mounted to the frame in a way that constrains one or more degrees of freedom of motion of the clamps relative to the frame while allowing flexibility in at least one other DOF. Degrees of freedom can be provided by, for example, one or more respective flexures coupling each clamp to the frame.

Figure 9A:
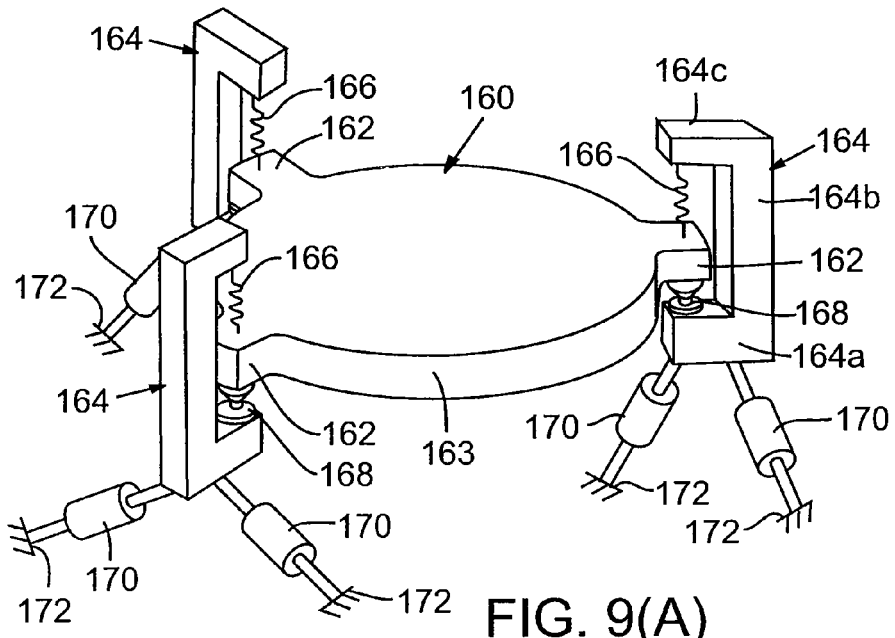
FIG. 9(A) is a perspective view of an optical element being held by three "C"-type clamps configured as shown in FIG. 5(A), wherein each clamp is supported by two respective flexures each providing at least one DOF of motion of the clamp relative to the frame.

In FIG. 9(A), an embodiment of a substantially kinematic mounting for an optical element 160 is shown. The optical element 160 comprises three mounting tabs 162 extending outward from the peripheral edge 163 of the element in a manner similar to FIG. 1(B). The optical element 160 is circular, and the mounting tabs 162 are oriented approximately 120° apart. The mounting tabs 162 are held by separate clamps 164. Each clamp 164 is configured as a C-clamp, similar to the clamp 200 shown in FIG. 6, and includes a seat (lower) portion 164a, a body portion 164b, and an arm (upper) portion 164c. A respective conformable clamp seat 168, similar to the seat 210 shown in FIG. 5(A), is mounted to each seat portion 164a. A respective tab 162 extends into the clamp 164 and rests on the respective seat 168. Means for applying clamping force on the tabs 162 by the clamps 164 are represented by respective springs 166. The seat portion 164a (lower end) of each clamp 164 is mounted to a frame 172 by respective pairs of flexures 170 each having low stiffness in at least one respective DOF relative to the frame. The flexures 170 of each clamp 164 are in a splayed configuration, and are mounted to the frame 172 that is schematically represented.

It will be understood that the optical element 160 can have a profile other than circular, and the mounting tabs 162 are not necessarily limited to three or to an equi-angular arrangement thereof as shown.

In the embodiment of FIG. 9(A) the seats 168 constrain the optical element in the z-direction and in the tangent directions. Therefore, the intermediate section 210b (FIG. 6) must be sufficiently stiff and strong in both the z-direction and y-direction to meet the static and dynamic positioning requirements of the optical element 160.

Figure 9B:
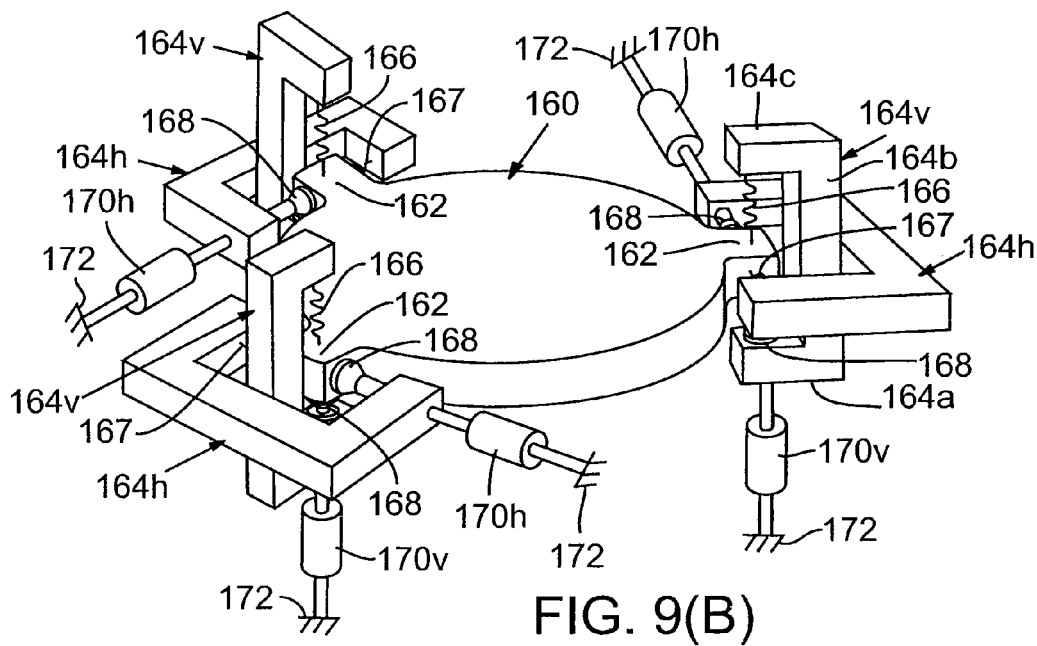
FIG. 9(B) is an alternative configuration of the FIG. 9(A) embodiment, in which the optical element is being held by six "C"-type clamps; each clamp is supported by one respective flexure providing at least one DOF of motion of the clamp relative to the frame.

An alternative embodiment is shown in FIG. 9(B), in which components that are similar to corresponding components shown in FIG. 9(A) have the same respective reference numerals and are not described further. In FIG. 9(B) six clamps hold the optical element 160; three of the clamps 164v are "vertical" and three 164h are "horizontal" (tangential). Each tab 162 is engaged with one respective vertical clamp 164v and one respective horizontal clamp 164h. Each clamp 164h, 164v has a "C" configuration and includes a respective seat 168 as discussed above. Mounted to the vertical clamps 164v are respective "vertical" flexures 170v, and mounted to the horizontal clamps 164h are respective "horizontal" flexures 170h. The flexures 170h, 170v are coupled to the frame 172. Each flexure 170h, 170v constrains the respective clamp 164h, 164v in a respective one DOF, in line with the seats 168. Six DOFs of the lens are constrained. As distinct from the embodiment of FIG. 9(A), in FIG. 9(B) the lateral (x, y) stiffness of the intermediate portion 210b of each seat 168 is less critical, but nevertheless is still important for supporting and constraining the respective clamp.

Figure 10:
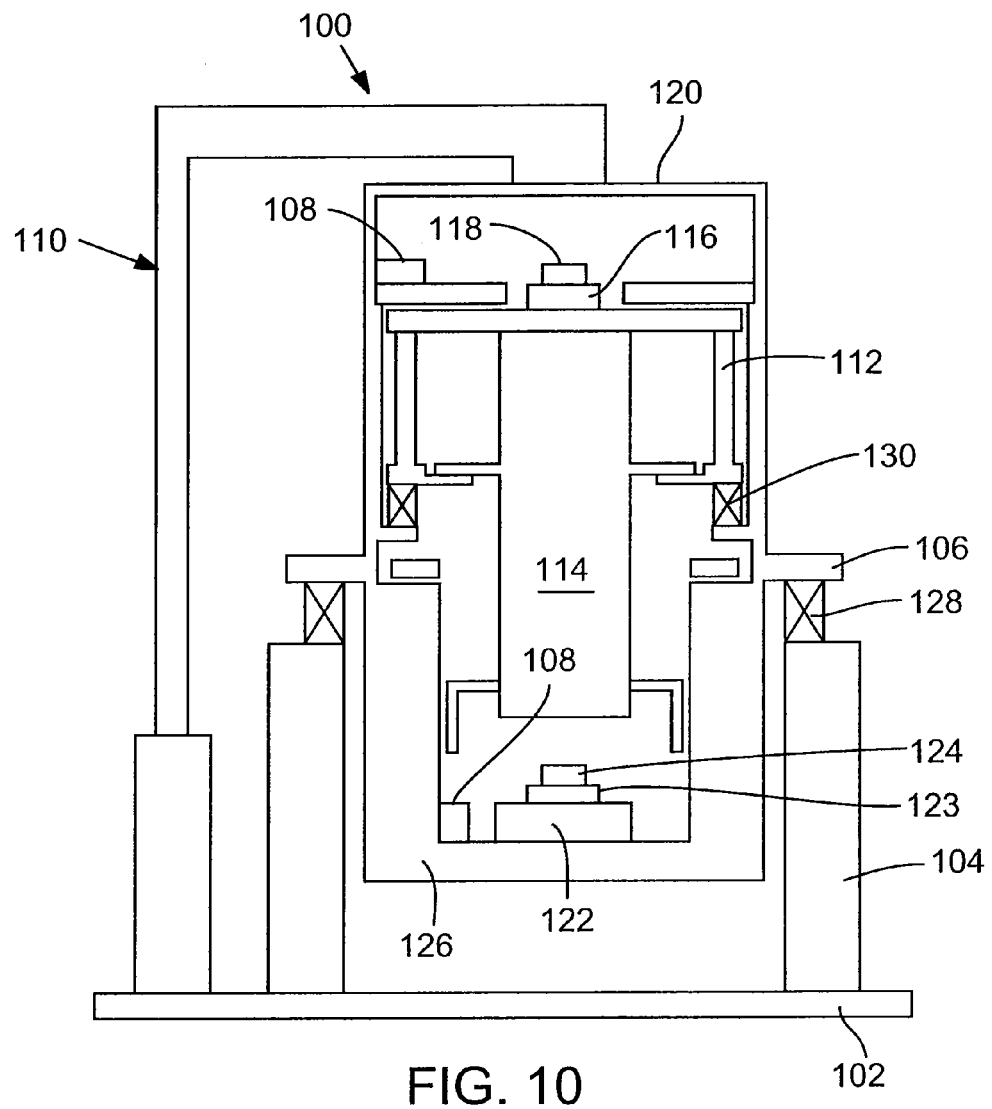
FIG. 10 is an elevational diagram of an embodiment of a lithographic exposure system incorporating an optical system as described herein.

FIG. 10 shows a typical lithographic exposure system 100 incorporating an optical system that comprises a mounted optical element as described above. The system 100 comprises a mounting base 102, a support frame 104, a base frame 106, a measurement system 108, a control system (not shown), an illumination-optical system 110, an optical frame 112, an optical system 114, a reticle stage 116 for holding and moving a reticle 118, an upper enclosure 120 surrounding the reticle stage 116, a substrate stage 122 for holding and moving a lithographic substrate (e.g., a semiconductor wafer), and a lower enclosure 126 surrounding the substrate stage 122. The illumination-optical system 110 and/or the optical system 114 can include an optical element mounted in the manner described above. The substrate stage 122 is mounted on a substrate table 123.

The support frame 104 typically supports the base frame 106 above the mounting base 102 via a base vibration-isolation system 128. The base frame 106, in turn, supports (via an optical vibration-isolation system 130) the optical frame 112, the measurement system 108, the reticle stage 116, the upper enclosure 120, the optical device 114, the substrate stage 122, the substrate table 123, and the lower enclosure 126 about the base frame 106. The optical frame 112, in turn, supports the optical device 114 and the reticle stage 116 above the base frame 106 via the optical vibration-isolation system 130. As a result, the optical frame 112, the components supported thereby, and the base frame 106 are effectively attached in series, via the base vibration-isolation system 128, to the mounting base 102. The vibration-isolation systems 128, 130 are configured to damp and isolate vibrations between components of the exposure system 100; each of these systems comprises a vibration-damping device. The measurement system 108 monitors the positions of the stages 116, 122 relative to a reference such as the optical device 114 and outputs position data to the control system. The optical device 114 typically includes a lens assembly that projects and/or focuses light or a light beam from the illumination-optical system that passes through or reflects from the reticle 118. The reticle stage 116 is attached to one or more movers (not shown) directed by the control system to position the reticle 118 precisely relative to the optical device 114. Similarly, the substrate stage 122 includes one or more movers (not shown) to position the substrate 124 with the substrate table 123 precisely relative to the optical device (lens assembly) 114.

As will be appreciated by persons of ordinary skill in the relevant art, there are a number of different types of photolithographic systems. For example, the exposure system 100 can be a scanning-type photolithography system that progressively exposes a pattern from the reticle 118 onto a substrate 124 as the reticle 118 and substrate 124 are moved synchronously. The reticle 118 is moved perpendicularly to the optical axis of the optical device 114 by the reticle stage 116 as the substrate 124 is moved perpendicularly to the optical axis of the optical device 114 by the substrate stage 122. Scanning of the reticle 118 and the substrate 124 occurs while the reticle 118 and the substrate 124 are moving synchronously.

Alternatively, the exposure system 100 can be a step-and-repeat type of photolithography system that exposes the reticle 118 while the reticle 118 and substrate 124 are stationary. The substrate 124 is in a constant position relative to the reticle 118 and the optical device 114 during exposure of an individual field. Subsequently, between consecutive exposure steps, the substrate 124 is consecutively moved by the substrate stage 122 perpendicularly to the optical axis of the optical device 114 so that the next field of the substrate is brought into position relative to the optical device 114 and the reticle 118 for exposure. Following this process, the pattern defined on the reticle 118 is sequentially exposed onto the fields of the substrate 124 so that the next field of the substrate 124 is brought into position relative to the optical device 114 and the reticle 118.

The use of an exposure system 100 provided herein is not limited to a photolithography system as used for semiconductor-device manufacturing. The exposure system 100, for example, can be used as an LCD photolithography system that exposes the pattern of a liquid-crystal display (LCD) device onto a planar glass plate or as a photolithography system used for manufacturing a thin-film magnetic head. Further alternatively, the system 100 can be used to perform proximity photolithography. In proximity photolithography (used, e.g., for exposing mask patterns) a mask and the substrate are positioned very closely together axially and exposed without the use of a lens assembly therebetween. In general, the system 100 can be used in any of various other applications, including other semiconductor-processing applications, machine tools, cutting machines, and inspection machines, particular machinery in which it is important to prevent transmission of vibrations to optical elements.

The illumination source (of the illumination-optical system 110) can be g-line (436 nm), i-line (365 nm), KrF excimer laser (248 nm), ArF excimer laser (193 nm), or $F_2$ excimer laser (157 nm). Alternatively, the illumination source can produce a charged particle beam such as an electron beam. Further alternatively, the illumination source can be an X-ray source or source of "soft" X-rays (extreme ultraviolet light). Example electron-beam sources are thermionic-emission types such as lanthanum hexaboride ($LaB_6$) sources and tantalum (Ta) sources, configured as an electron "gun." Electron-beam systems can be based on projection lithography (using a mask or reticle) or direct-writing lithography (in which the pattern is directly formed on the substrate without having to use a mask).

With respect to the optical device 114, when a deep-UV source such as an excimer laser is used as the source, glassy materials such as quartz and fluorite that transmit deep-UV rays are preferably used. When an $F_2$ excimer laser or X-ray source is used, the optical device 114 should be either catadioptric or reflective (the reticle, if used, should also be reflective). When an electron-beam source is used, electron optics should be used such as electron lenses and deflectors. The optical path for the electron beams or X-rays should be in a vacuum.

Also, with an exposure system that employs vacuum-UV radiation (wavelength of 200 nm or less), use of a catadioptric optical system can be considered. Examples of the catadioptric type of optical system are disclosed in Japan Patent Publication No. Hei 8-171054, corresponding to U.S. Pat. No. 5,668,672, and Japan Patent Publication No. Hei 10-020195, corresponding to U.S. Pat. No. 5,835,275, all incorporated herein by reference. In these cases, the reflective optical device can be a catadioptric optical system incorporating a beam-splitter and a concave mirror. Japan Patent Publication No. Hei 8-334695 and its counterpart U.S. Pat. No. 5,689,377 and Japan Patent Publication No. Hei 10-003039 and its counterpart U.S. Pat. No. 5,892,117, all incorporated herein by reference, use a reflective-refractive type of optical system incorporating a concave mirror, etc., but without a beam-splitter.

Further, in photolithography systems, if linear motors (see U.S. Pat. Nos. 5,623,853 and 5,528,118, both incorporated herein by reference) are used in the substrate stage or reticle stage, the linear motors can be either air-levitation type, employing air bearings, or magnetic-levitation type, using Lorentz force or reactance force. The stage can move along a guide, or it can be guideless.

Alternatively, one of the stages can be driven by a planar motor, which drives the stage by electromagnetic force generated by a magnet unit, having two-dimensionally arranged magnets, and an armature-coil unit having two-dimensionally arranged coils in facing positions. With this type of driving system, either the magnet unit or the armature-coil unit is connected to the stage, and the other unit is mounted on the moving-plane side of the stage.

Movements of a stage, as described above, generate reaction forces that can affect performance of the photolithography system. Reaction forces generated by the substrate-stage motion can be mechanically released to the floor (ground) using a frame member as described in U.S. Pat. No. 5,528,118 and Japan Patent Publication No. Hei 8-166475, both incorporated herein by reference. Reaction forces generated by the reticle-stage motion can be mechanically released to the floor (ground) using a frame member as described in U.S. Pat. No. 5,874,820 and Japan Patent Publication No. Hei 8-330224, both incorporated herein by reference.

A photolithography system according to the above-described embodiments can be built by assembling various subsystems, including each element listed in the appended claims, in such a manner that prescribed mechanical accuracy, electrical accuracy, and optical accuracy are achieved and maintained. To obtain the various accuracies, prior to and following assembly every optical system is adjusted to achieve its specified optical accuracy. Similarly, mechanical and electrical systems are adjusted to achieve their respective specified mechanical and electrical accuracies. The process of assembling each subsystem into a photolithography system includes mechanical interfaces, electrical-circuit wiring connections, and air-pressure plumbing connections between each subsystem. There is also a process where each subsystem is assembled prior to assembling a photolithography system from the various subsystems. Once a photolithography system is assembled from the various subsystems, total system calibration and adjustment are performed to make sure that each accuracy specification is achieved and maintained in the complete photolithography system. It is desirable to manufacture an exposure system in a clean-room where the temperature, humidity, and particle load are controlled.

Figure 11:
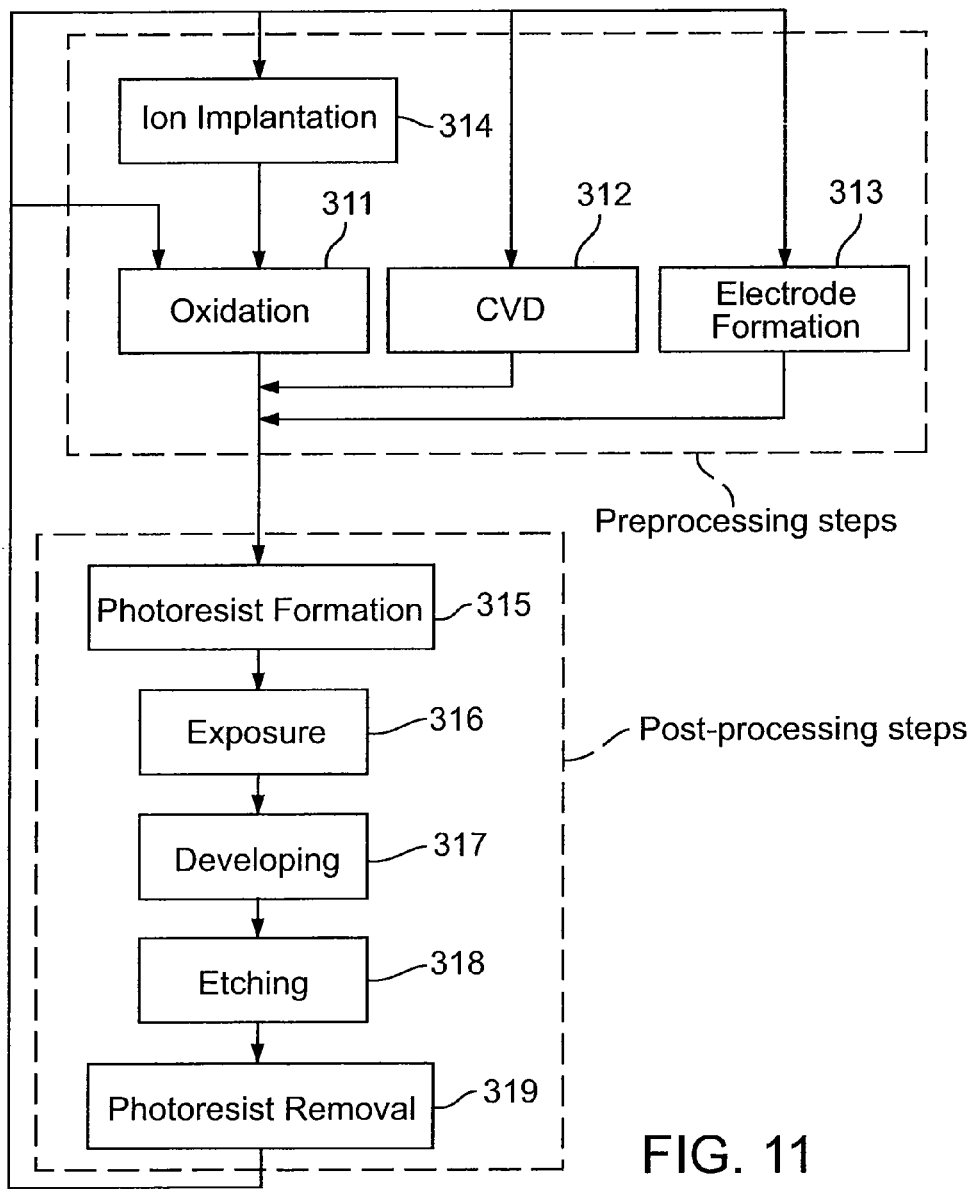
FIG. 11 is a process-flow diagram illustrating an exemplary process by which micro-devices are manufactured using a system as shown in FIG. 10.

Semiconductor devices and other micro-devices can be fabricated using a system as described above, using a process shown generally in FIG. 11. In step 301 the function and performance characteristics of the micro-device are established and designed. In step 302 a mask (reticle) defining a pattern is designed according to the previous design step 301. In a parallel step 303 a substrate (e.g., semiconductor wafer) is made from an appropriate material (e.g., silicon). In step 304 the mask pattern designed in step 302 is exposed onto the substrate from step 303 using a photolithography system such as one of the systems described above. In step 305 the semiconductor device is assembled by executing a dicing step, a bonding step, and a packaging step. The completed device is inspected in step 306.

Figure 12:
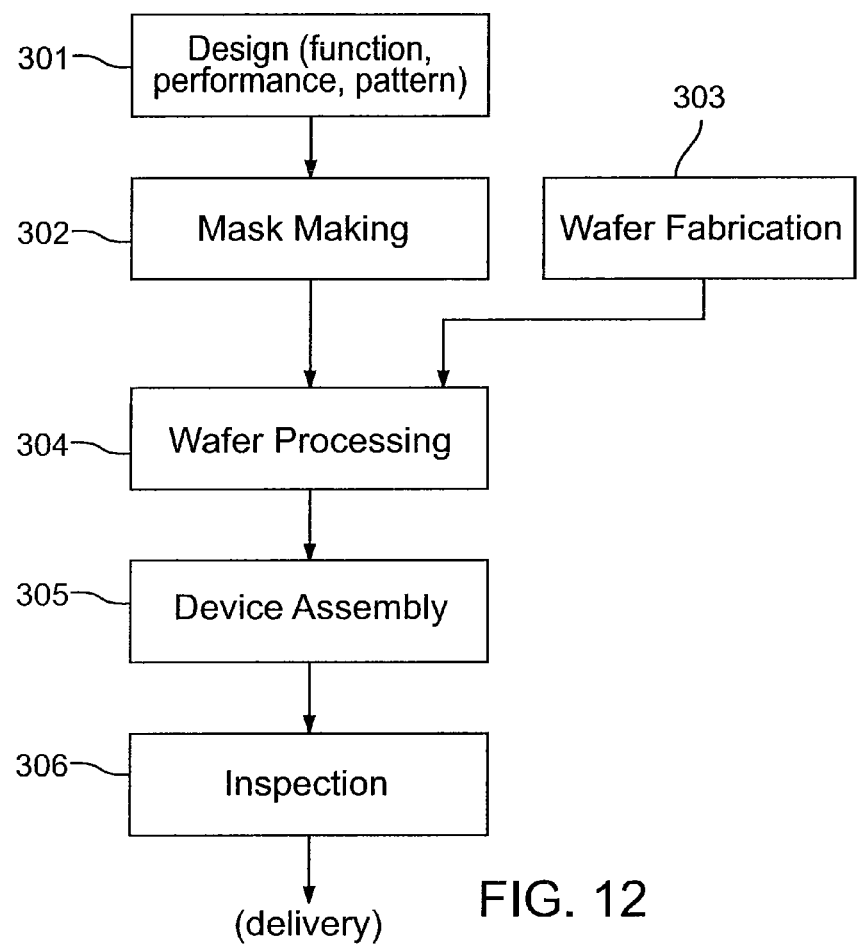
FIG. 12 is a process-flow diagram of the wafer-processing step shown in FIG. 11 in the case of fabricating micro-devices.

FIG. 12 depicts an example flow-chart of step 304 in the case of fabricating semiconductor devices. In step 311 (oxidation) the substrate surface is oxidized. In step 312 (CVD) an insulation layer is formed on the substrate surface. In step 313 (electrode-formation) electrodes are formed on the substrate by vapor deposition or other suitable technique. In step 314 (ion-implantation) ions are implanted in the substrate as required. The steps 311-314 constitute "pre-processing" steps for substrates during substrate processing, and selection is made at each step according to processing requirements.

At each stage of substrate processing, upon completion of the pre-processing steps, the following post-processing steps are performed. In step 315 (photoresist formation) photoresist is applied to the substrate. In step 316 (exposure) the exposure system is used to transfer the circuit pattern of a mask or reticle to the substrate. In step 317 (developing) the exposed substrate is developed. In step 318 (etching) parts other than residual photoresist (i.e., exposed-material surfaces) are removed by etching. In step 319 (photoresist removal) unnecessary photoresist remaining after etching is removed. Multiple circuit patterns are formed by repetition of these pre-processing and post-processing steps.

Whereas the invention has been described in connection with representative embodiments, it will be understood that it is not limited to those embodiments. On the contrary, the invention is intended to encompass all modifications, alternatives, and equivalents as may be included within the spirit and scope of the invention, as defined by the appended claims.

What is claimed is:

1. An optical system, comprising:
  a frame;
  an optical element including a mounting feature;
  at least one clamp applying a respective clamping force to a respective location on the mounting feature to hold the optical element relative to the frame;
  a respective mounting coupling the clamp to the frame, the mounting constraining at least one degree of freedom of motion of the clamp relative to the frame;
  the clamp comprising a respective seat having an upper portion and an intermediate portion, the upper portion being engaged with the respective location on the mounting feature, and the intermediate portion being situated between the upper portion and the clamp and having a lateral thickness less than a lateral thickness of the upper portion, the intermediate portion exhibiting elastic and/or plastic deformability in multiple degrees of freedom sufficient for a moment applied by the clamp to the mounting feature to be limited to less than a designated peak moment, while maintaining substantially full engagement of the upper portion with the respective location.

2. The system of claim 1, wherein:
  at least the intermediate portion of the seat is made of a ductile metal; and
  the intermediate portion has a lateral thickness substantially equal to its length.

3. The system of claim 2, wherein the metal is selected from a group consisting of mild steel, stainless steel, invar, aluminum alloy, and copper alloy.

4. The system of claim 1, wherein the mounting comprises at least one flexure.

5. The system of claim 1, wherein the designated peak moment is less than a maximum allowable moment for the mounting feature.

6. The system of claim 1, wherein:
  the mounting feature comprises multiple mounting tabs;
  each mounting tab is engaged with a respective clamp; and
  each clamp is mounted to the frame by a respective mounting that constrains at least one respective degree of freedom of motion of the clamp relative to the frame.

7. The system of claim 6, wherein each clamp is a C-clamp.

8. The system of claim 1, wherein the mountings collectively couple the optical element to the frame in a substantially kinematic manner.

9. The system of claim 1, wherein the seat exhibits a combination of high vertical stiffness and ductility.

10. The system of claim 1, wherein:
  the seat further comprises a base portion;
  the intermediate portion is situated between the base portion and the upper portion; and
  the base portion couples the seat to the clamp.

11. A lithography system, comprising:
  a stage for holding and moving an object; and an optical system situated relative to the stage and configured to direct an energy beam to or from the object on the stage;
  the optical system comprising a frame, an optical element including a mounting feature, at least one clamp, and a respective mounting, the at least one clamp applying a respective clamping force to a respective location on the mounting feature to hold the optical element relative to the frame, the respective mounting coupling the clamp to the frame and constraining at least one degree of freedom of motion of the clamp relative to the frame, the clamp further comprising a respective seat having at least an upper portion and an intermediate portion, the upper portion being engaged with the respective location on the mounting feature, and the intermediate portion being situated between the upper portion and the clamp and having a lateral thickness less than a lateral thickness of the upper portion, the intermediate portion exhibiting elastic and/or plastic deformability in multiple degrees of freedom sufficient for any moment applied by the clamp to the mounting feature to be limited to less than a designated peak moment, while maintaining substantially full engagement of the upper portion with the respective location.

12. The system of claim 11, wherein:
  the stage is a reticle stage;
  the object is a reticle; and the optical system is an illumination-optical system or a projection-optical system.

13. The system of claim 11, wherein:
the stage is a substrate stage;
the object is a lithographic substrate; and
the optical system is a projection-optical system.

14. The system of claim 11, wherein the optical element is a refractive optical element or a reflective optical element.

15. The system of claim 11, wherein:
the seat is made of a ductile metal; and
the intermediate portion has a lateral thickness substantially equal to its length.

16. The system of claim 15, wherein the ductile metal is selected from a group consisting of mild steel, stainless steel, invar, aluminum alloy, and copper alloy.

17. The system of claim 11, wherein the mounting comprises at least one flexure.

18. The system of claim 11, wherein the designated peak moment is less than a maximum allowable moment for the mounting feature.

19. The system of claim 11, wherein:
the mounting feature comprises multiple clamping locations;
each clamping location is engaged with a respective clamp; and
each clamp is mounted to the frame by a respective mounting that constrains at least one respective degree of freedom of motion of the clamp relative to the frame.

20. The system of claim 19, wherein the mountings collectively provide a substantially kinematic mounting of the optical element relative to the frame.

21. The system of claim 19, comprising three equi-angularly placed clamps engaged with respective clamping locations on the mounting feature.

22. A method for mounting to a frame an optical element having a mounting feature, the method comprising:
mounting multiple clamps to the frame using respective mountings situated between the clamps and the frame, each mounting constraining at least one respective degree of freedom of motion of the respective clamp relative to the frame;
mounting the optical element to the clamps by engaging respective locations on the mounting feature between the respective clamp and a respective clamp seat attached to the clamp;
configuring each seat with an intermediate portion and an upper portion that engages the respective location on the mounting feature, the intermediate portion having a lateral thickness less than a lateral thickness of the upper portion and exhibiting elastic and/or plastic deformability in multiple degrees of freedom sufficient for any moment applied by the clamp to the mounting feature to be limited to less than a designated peak moment while maintaining substantially full engagement of the upper portion with the respective location; and
causing each clamp to apply a respective clamping force to the respective location on the mounting feature to hold the optical element relative to the frame.

23. The method of claim 22, wherein the mounting collectively provides a substantially kinematic mounting of the optical element relative to the frame.

24. The method of claim 23, further comprising:
before mounting the optical element to the clamps, placing an assembly fixture relative to the frame to support the clamps relative to the frame; and
after causing the clamps to apply respective clamping forces, removing the assembly fixture.

25. In a lithography system, an optical system comprising:
a frame;
at least one optical element including a mounting feature;
at least one clamp applying a respective clamping force to a respective location on the mounting feature to hold the optical element relative to the frame;
a respective mounting coupling the clamp to the frame, the mounting constraining at least one degree of freedom of motion of the clamp relative to the frame;
the clamp comprising a respective seat having an upper portion and an intermediate portion, the upper portion being engaged with the respective location on the mounting feature and the intermediate portion being situated between the upper portion and the clamp, the intermediate portion having a lateral thickness less than a lateral thickness of the upper portion, the intermediate portion exhibiting elastic and/or plastic deformability in multiple degrees of freedom sufficient for any moment applied by the clamp to the mounting feature to be limited to less than a designated peak moment, while maintaining substantially full engagement of the upper portion with the respective location.

26. The system of claim 25, wherein:
the mounting feature comprises multiple clamping locations;
each clamping location is engaged with a respective clamp; and
each clamp is mounted to the frame by a respective mounting that constrains at least one respective degree of freedom of motion of the clamp relative to the frame.

27. The system of claim 25, wherein the mountings collectively provide a substantially kinematic mounting of the optical element relative to the frame.

28. The system of claim 25, comprising three equi-angularly placed clamps engaged with respective clamping locations on the mounting feature, one clamp per clamping location.

29. The system of claim 25 comprising three pairs of equi-angularly placed clamps engaged with respective clamping locations on the mounting feature, two clamps per clamping location.

30. An optical element, comprising:
a mounting feature;
multiple clamps applying respective clamping forces to respective locations on the mounting feature to hold the optical element relative to a support;
respective mountings coupling the clamps to the support, each mounting constraining at least one respective degree of freedom of motion of the respective clamp relative to the support;
each clamp comprising a respective seat having an upper portion and an intermediate portion, the upper portion being engaged with the respective location on the mounting feature and the intermediate portion being situated between the upper portion and the clamp, the intermediate portion having a lateral thickness less than a lateral thickness of the upper portion, the intermediate portion exhibiting elastic and/or plastic deformability in multiple degrees of freedom sufficient for any moment applied by the clamp to the mounting feature to be limited to less than a designated peak moment, while maintaining substantially full engagement of the upper portion with the respective location.

31. The optical element of claim 30, configured as a reflective or refractive optical element.

32. The optical element of claim 30, wherein the mountings collectively provide a substantially kinematic mounting of the optical element relative to the support.

33. A clamp for holding an optical element relative to a support, comprising:

a first arm, a second arm, and a member connecting together the first and second arms, such that a respective portion of a mounting feature of the optical element is inserted between the first and second arms;

the first arm applying a clamping force directed to the respective portion of the mounting feature; and the second arm comprising a seat having an upper portion and an intermediate portion, the upper portion being engaged with the respective location on the mounting feature and the intermediate portion being situated between the upper portion and the second arm, the intermediate portion having a lateral thickness less than a lateral thickness of the upper portion, the intermediate portion exhibiting elastic and/or plastic deformability in multiple degrees of freedom sufficient for any moment applied by the clamp to the mounting feature to be limited to less than a designated peak moment, while maintaining substantially full engagement of the upper portion with the respective location.

34. The clamp of claim 33, further comprising a mounting coupling the clamp to the support, the mounting constraining at least one degree of freedom of motion of the clamp relative to the support.

35. The clamp of claim 33, wherein the seat further comprises a base portion by which the seat is attached to the second arm.

36. The clamp of claim 33, wherein the seat is made of a ductile metal selected from the group consisting of mild steel, stainless steel, invar, aluminum alloy, and copper alloy.

37. The clamp of claim 33, wherein the intermediate portion has a length substantially equal to its transverse thickness.

38. The clamp of claim 33, wherein the upper portion has a transverse thickness two to four times greater than a transverse thickness of the intermediate portion.

* * * * *